United States Patent [19]

Loth

[11] Patent Number: 4,640,869

[45] Date of Patent: Feb. 3, 1987

[54] HARD METAL WATCH CASE WITH A RESISTANT COATING

[75] Inventor: Eric Loth, Bienne, Switzerland

[73] Assignee: Montres RADO SA, Lengnau, Switzerland

[21] Appl. No.: 731,222

[22] Filed: May 7, 1985

[30] Foreign Application Priority Data

Jun. 7, 1984 [CH] Switzerland .................. 2781/84

[51] Int. Cl.⁴ .................. B32B 9/00; B32B 15/04
[52] U.S. Cl. .................. 428/469; 428/698; 428/699; 428/627; 428/657
[58] Field of Search .............. 428/698, 699, 469, 627, 428/657, 579

[56] References Cited

U.S. PATENT DOCUMENTS

| | | | |
|---|---|---|---|
| 3,242,664 | 3/1966 | Lederrey | 428/579 X |
| 4,101,703 | 7/1978 | Schintlmeister | 428/698 X |
| 4,252,862 | 2/1981 | Nishida | 428/627 X |

FOREIGN PATENT DOCUMENTS

| | | | |
|---|---|---|---|
| 2528255 | 2/1976 | Fed. Rep. of Germany | 428/698 |
| 2302350 | 1/1981 | France . | |
| 148349 | 9/1976 | German Democratic Rep. . | |
| 0039785 | 3/1984 | Japan | 428/698 |

OTHER PUBLICATIONS

Schintlmeister et al, "Cutting Tool Materials", *Wear*, 100, 1984, 153–169, CVD, Metallwerk Plansee.

*Primary Examiner*—Nancy Swisher
*Attorney, Agent, or Firm*—Griffin, Branigan, & Butler

[57] ABSTRACT

The watch case has its body fashioned of hard metal of hardness preferably greater than 1400 Vickers. The body is overlaid by a two layer coating. The chemical composition of the two layers is identical and comprises the combination of a metal and an element whose atomic number is less than 9. The first layer is deposited by CVD and the second by PVD. If the metal is titanium and the element nitrogen there is obtained on the body of the scratch proof case a perfectly adhering hard coating of gold color.

5 Claims, No Drawings

HARD METAL WATCH CASE WITH A RESISTANT COATING

This invention concerns a watch case comprising a case body overlaid by a coating.

BACKGROUND OF THE INVENTION

In order to give a pleasing appearance to the base material of a watch case, e.g. of steel this will generally be coated over at least its visible portions by a galvanic layer for instance. It is thus that there may be obtained in a known manner a chrome or gold plated case. It is known that these coatings are of small wear resistance and almost no abrasion resistance.

To overcome this difficulty, the French patent document No. 2 425 210 (corresponding to U.S. Pat. No. 4,252,862) suggests coating the object with a layer of titanium nitride (TiN) which, at the same time as being hard and resistant to abrasion, exhibits an external surface of a colour approximating that of gold. However, in the cited document, there has been foreseen solely the employment of brass or of stainless steel as the basic body of the object. These metals generally exhibit a matt surface and it will be noted that following application of TiN, the surface of the object is extremely sensitive to finger marks which leave indelible prints. To overcome this difficulty the cited document suggested covering the layer of TiN by a layer of gold or gold alloy which in addition would further improve the resemblance of the colour to that of gold. According to the explanations given in this same document, the layer of TiN is applied by physical vapour deposition (PVD).

It is found that if one applies the teaching of the cited document to a case body of hard metal, the hardness of which exceeds Vickers 600 $HV_1$ (for example at least temperated steel DIN 1.4125 or Stellite) but being preferably in the neighbourhood of 1400 $HV_5$ (for instance tungsten carbide), it will be noted that the fingers no longer leave the undesired prints since the body of the case exhibits a polished surface. It will thus no longer be necessary to apply a supplementary layer of gold. At the same time, it is noted that the adhesion of the layer of TiN on the hard metal substrate is poor. This is due in particular to the fact that there exist heavy strains between the layer of TiN and its support, such strains being evidenced during measurement of the Vickers hardness where one will note frequent chipping of the layer of TiN at the time that the measuring punch in the form of a lozenge is applied. This default of poor adhesion may also be evidenced by a file test (file having a hardness of 45 Rockwell with 30 lines per centimeter).

To minimize the strains as mentioned hereinabove, it is well known to interpose a layer of titanium (Ti) between the body of the hard metal case and the layer of TiN. This will result in a better adhesion of the layer of TiN since the strains as indicated are absorbed by the soft undercoating of titanium. At the same time, apart from the fact that the layer of TiN may still be removed quite easily because of the low hardness of the titanium layer ($<300\ HV_1$), the proposed solution loses a great deal of its interest since the scratch proof nature of the case body disappears owing to the presence of titanium as an undercoating. To overcome this difficulty, one could reduce the thickness of the titanium layer to less than 0.2 μm. Experience has shown however that such a thin layer is very difficult to obtain. In any event and as has been mentioned, the coating will not resist the file test.

To conclude what has just been said, all methods known to this day and comprising the deposition of a TiN layer by physical vapour deposition (PVD) onto a hard metal are unsuitable to satisfy the scratchproof criterion.

In following through the investigations in this domain, the applicant sought to deposit a layer of titanium nitride onto a hard metal no longer by the PVD procedure, but by chemical vapour deposition (CVD). It was then possible to obtain a layer of TiN very adherent to the case body (chemical bond) and at the same time satisfying the file test as mentioned hereinabove. However such layer exhibited not only a colour remote from that of gold, but further a lack of evenness as to the coloration obtained.

SUMMARY OF THE INVENTION

To overcome the difficulties cited above, the present invention proposes a watch case body of which the hardness is greater than 600 $HV_1$ overlaid by a coating comprising a first layer obtained by a combination of a metal and an element of which the atomic number is less than 9, applied to the case body by chemical vapour deposition (CVD) and a second layer of a composition similar to that of the first layer and applied over the first layer by physical vapour deposition (PVD).

For tools employed in machining metals such as cutting tools it has already been proposed to provide a hard metal with a double coating, the first layer of which is deposited by CVD, and the second by PVD. This may be seen in particular in the GDR patent document DD No. 148 349. However herein the purpose of the CVD deposited layer is only that of improving the adhesion of the PVD deposited layer onto the hard metal and the problem solved by the present invention of obtaining a uniformly coloured coating approaching the colour of gold has not been addressed. To solve the present problem it is further necessary to employ CVD and PVD layers of similar composition, this being in no manner disclosed or even suggested in the cited document.

Furthermore in French patent document FR No. 2 302 350 there has been disclosed a utilitarian object such as an article of jewellery provided with a coating layer of hard material under which is found a hard zone constituted by metals or metallic combinations the outer surface of which exhibits a Vickers hardness greater than 700. However none of the numerous examples described in this document sugests the double layer coating of the present invention. Likewise in this prior disclosure, if there is a question of adhesion, nowhere is there any mention of the aesthetic problem of obtaining an object having a perfectly homogeneous colour.

DESCRIPTION OF THE PREFERRED EMBODIMENT

As has already been said, the watch case comprises initially a massive case body formed by a hard material, the hardness of which is at least 600 $HV_1$. Preferably this will be scratch-proof material the hardness of which is on the order of or greater than 1400 $HV_5$. This material which may comprise titanium carbide (TiC), tungsten carbide (WC) or a ceramic is smooth and polished. It is obtained by means known to the state of the art and which are taught for instance in U.S. Pat. No. 3,242,664.

According to the invention, the case body thus formed is coated with a first layer by chemical vapour deposition. This operation known per se may be successfully applied in the following manner: the case body is brought into an enclosure. The pressure in the interior of the enclosure is reduced following which it is heated to a high temperature (900° to 1100° C.). Thereafter there is circulated a gas containing $TiCl_4 + H_2$ which reacts with the nitrogen contained in the atmosphere of the enclosure. The gas precipitates on the surface of the article to be coated and the nitrogen combines with the titanium in order to form the first layer of TiN. From the duration of the treatment will depend the thickness of the layer attained. In a practical example, the first layer will have a thickness less than 3 $\mu$m. As has been already explained, this first layer adheres perfectly onto the hard metal. Its colour on the other hand bears only a relatively slight resemblance to that of gold.

Continuing in accordance with the invention, the case body thus coated has thereafter a second layer applied thereto by physical vapour deposition. Several methods are known for this procedure. One of these consists of introducing the article to be treated into an enclosure containing a target formed of titanium or titanium nitride.

In the enclosure a hard vacuum ($\sim 10^{-5}$ Torr) is obtained by pumping. Then the article undergoes ionic cleaning at high voltage (1 KV). Thereafter argon and nitrogen are introduced into the enclosure and an electroluminescent discharge is created which ionizes the argon given rise to a plasma. Such plasma removes particles from the target which thereafter will be deposited in the form of titanium nitride on the article to be coated. Here likewise the thickness of the layer will depend on the length of the operation. In a practical example the layer thickness will be limited to 1 $\mu$m. As has been explained above, the final colour obtained by this procedure is perfectly controllable and if the second layer is of TiN one may obtain a colour very closely approaching that of gold.

What has just been said may be evidenced by measurement of the optical reflectivity of articles undergoing examination in which the reflectivity R is percentage (%) is represented as a function of the wave length of light $\lambda$ is nano-meters (nm). For fine gold the quotient of reflectivity at 600 nm (R600) relative to the reflectivity at 450 nm (R450) is 2.5. Measured under the same conditions, this quotient arrives at 3.9 for a layer of TiN deposited by CVD (this indicating a strong yellow colour) while said quotient arrives at 2.6 for the layer TiN deposited by PVD (this indicating a colour very close to that of gold). These measurements repeated at various points of the surface under examination shown furthermore an important dispersion for the layer deposited by CVD while this dispersion is minimal for the layer deposited by PVD. Moreover, simple visual observation will readily confirm the results of these measurements.

It will be also understood that the first layer may be deposited without any particular precautions in order to obtain a coating which will be the same for all articles. On the other hand, by modifying the parameters applicable to the deposition of the second layer one may obtain different results according to the colour ultimately desired, e.g. pale yellow or yellow gold 24 carats.

It will be further noted that the adhesion of TiN deposited by PVD on TiN deposited by CVD is excellent, and in any case much better than the adhesion of TiN deposited by PVD directly onto the hard metal. Moreover, if by any chance the layer of TiN deposited by PVD should be partially removed, there will still remain the undercoating of TiN deposited by CVD which, as has been said, may approach at least slightly the colour of gold.

If the preferred purpose of this invention is to obtain a coating of a watch case resembling as closely as possible that of gold, it is likewise possible to obtain other colours. For instance, one may obtain a white colour by depositing in accordance with the invention two layers of titanium carbide or tungsten carbide. A blue colour may be obtained in the same manner by a double deposition of titanium oxide. A transparent coating could also be obtained by a double deposition of aluminium oxide ($Al_2O_3$). More generally, one will note that each of these layers comprises a combination of a metal (Al, Ti, W) and of an element the atomic number of which is less than 9 (N, C, O).

What I claim is:

1. A watch case comprising a case body overlaid by a coating, the hardness of the body being greater than 600 $HV_1$, the coating comprising a first layer obtained by the combination of a metal and an element whose atomic number is less than 9 applied to said body by chemical vapor deposition (CVD) and a second layer having the same composition as the first layer applied onto said first layer by physical vapor deposition (PVD).

2. A watch case as set forth in claim 1 wherein the case body is formed of a scratch proof material exhibiting a hardness greater than 1400 $HV_5$.

3. A watch case as set forth in claim 2 wherein the first and second coating layers comprise titanium nitride (TiN).

4. A watch case as set forth in claim 2 wherein the first and second coating layers comprise titanium carbide (TiC).

5. A watch case as set forth in claim 2 wherein the first and second coating layers comprise a metallic oxide.

* * * * *